(12) United States Patent
Okushima

(10) Patent No.: US 7,859,808 B2
(45) Date of Patent: Dec. 28, 2010

(54) ELECTROSTATIC PROTECTION CIRCUIT

(75) Inventor: Mototsugu Okushima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 249 days.

(21) Appl. No.: 12/149,577

(22) Filed: May 5, 2008

(65) Prior Publication Data

US 2008/0285190 A1    Nov. 20, 2008

(30) Foreign Application Priority Data

May 15, 2007    (JP)  ............................. 2007-129097

(51) Int. Cl.
*H02H 3/22*    (2006.01)
(52) U.S. Cl. ........................................ 361/56; 361/111
(58) Field of Classification Search .................... 361/56, 361/111
See application file for complete search history.

(56) References Cited

U.S. PATENT DOCUMENTS 6,385,028 B1 * 5/2002 Kouno ........................ 361/111
6,437,407 B1 * 8/2002 Ker et al. ..................... 257/357
2005/0231866 A1    10/2005 Mergens et al.

OTHER PUBLICATIONS

Ajith Amerasekera, "ESD in Silicon Integrated Circuits", Second Edition, Wiley, 2002, pp. 117-118.

* cited by examiner

*Primary Examiner*—Danny Nguyen
(74) *Attorney, Agent, or Firm*—McGinn IP Law Group, PLLC

(57) ABSTRACT

An electrostatic protection circuit, includes a first terminal, a second terminal, a MOS transistor including a gate, a source, and a drain, the gate being coupled to the first terminal, the source being coupled to the second terminal, and an electrostatic protection element connected to the drain, wherein the electrostatic protection element includes a first electrostatic protection element, and a second electrostatic protection element connected between the first terminal and the second terminal. The electrostatic protection circuit is constructed such that a maximum value of a voltage applied to a gate insulating film of the MOS transistor is alleviated to a value equal to or smaller than a desirable value by a current flowing into the first electrostatic protection element at a time of electrostatic application to the first terminal and an internal parasitic resistance of the MOS transistor connected with the second terminal.

6 Claims, 12 Drawing Sheets

ELECTROSTATIC PROTECTION CIRCUIT

BACKGROUND OF THE INVENTION

1. Field of the Invention

The present invention relates to an electrostatic protection circuit, and more particularly, to a protection circuit against electrostatic discharge (ESD) flowing from external terminals.

2. Description of the Related Art

A semiconductor integrated circuit (IC) device including MOS transistors requires an ESD tolerance against a surge voltage and a surge current which are applied to external terminals (input and output pads) of the semiconductor integrated circuit device by electrostatic discharge. Therefore, electrostatic protection circuits are normally connected with the external terminals. One of the electrostatic protection circuits to be used is a protection element including an NMOS transistor whose gate is grounded.

In recent years, along with a reduction in size of the semiconductor integrated circuit device, the tolerances of internal transistors against electrostatic discharge have become increasingly important. FIG. 10 shows the dependences of a breakdown voltage (VBD) of a gate oxide film and a clamp voltage (Vclamp) of a protection element on a gate oxide thickness. In FIG. 10, along with the reduction in transistor size, the gate oxide film becomes thinner and VBD rapidly reduces in substantially proportional to the thickness of the gate oxide film. In contrast to this, Vclamp of an NMOS type protection element whose gate is grounded does not substantially reduce, so a design window (VBD-Vclamp) indicating the ESD tolerance becomes smaller.

In order to extend the design window, it has been known that a sub-protection element is further provided for an element to be protected. The sub-protection element further reduces an electrostatic discharge voltage applied to the element to be protected, which leads to the extension of the design window. The main protection element handles a large electrostatic discharge current. In most case, an electrostatic discharge voltage can not be completely eliminated by the main protection element. The sub-protection element further reduces the electrostatic discharge voltage applied to the element to be protected, not to be completely eliminated by the main protection element.

An example of such an electrostatic protection circuit is described in AJITH AMERASEKERA, "ESD in Silicon Integrated Circuits", Second Edition, WILEY, 2002, pp. 117-118 (see FIG. 11). In FIG. 11, an electrostatic protection element 100a is provided between an input terminal In and a ground terminal GND and an electrostatic protection element 100b is provided between the input terminal In and a power supply terminal VDD. A resistor element R101 is provided between the input terminal In and a connection point between a gate of an Nch transistor N101 and a gate of a Pch transistor P101. A protection element 101, for example, an Nch transistor N102 whose drain is connected with the two gates and whose gate and source are connected with the ground terminal GND is provided between the connection point between the two gates and the ground terminal GND. The Nch transistor N101 and the Pch transistor P101 serve as an input stage driver (inverter circuit) and transfer a signal supplied to the input terminal In to an internal circuit.

In the electrostatic protection circuit having the structure as described above, each of the electrostatic protection elements 100a and 100b acts as the main protection element and the resistor element R101 and the protection element 101 act as the sub-protection element. The input stage driver corresponds to the element to be protected. That is, when a voltage VESD caused by electrostatic discharge is applied to the input terminal In, a discharge current Id which cannot be absorbed by the electrostatic protection element 100a flows into the ground terminal GND through the resistor element R101 and the protection element 101 (Nch transistor N102 which is broken down). At this time, a source-gate voltage Vstress of the Nch transistor N101 is alleviated by a breakdown voltage of the Nch transistor N102, thereby preventing the Nch transistor N101 from being damaged by electrostatic discharge.

Another example of the electrostatic protection circuit is described in US 2005/0231866 A (see FIG. 12). In FIG. 12, an electrostatic protection element 206 is provided between an input terminal In and a ground terminal VSS and an electrostatic protection element 208 is provided between the input terminal In and a power supply terminal VDD. An electrostatic protection element 226 is provided between the input terminal In (that is, a connection point between a gate of an Nch transistor 204 and a gate of a Pch transistor 202) and a source of the Nch transistor 204. An electrostatic protection element 228 is provided between the input terminal In and a source of the Pch transistor 202. An impedance circuit 224 such as a resistor element is provided between the source of the Nch transistor 204 and the ground terminal VSS. An impedance circuit 222 such as a resistor element is provided between the source of the Pch transistor 202 and the power supply terminal VDD. The Nch transistor 204 and the Pch transistor 202 serve as an input stage driver (inverter circuit) and transfer a signal supplied to the input terminal In to an output terminal OUTPUT.

In the electrostatic protection circuit having the structure as described above, each of the electrostatic protection elements 206 and 208 acts as the main protection element. A combination of the electrostatic protection element 226 and the impedance circuit 224 and a combination of the electrostatic protection element 228 and the impedance circuit 222 act as the sub-protection element. The input stage driver corresponds to the element to be protected. That is, when a voltage Vesd caused by electrostatic discharge is applied to the input terminal In, a discharge current which cannot be absorbed by the electrostatic protection element 206 flows into the ground terminal VSS through the electrostatic protection element 226 and the impedance circuit 224. At this time, a source-gate voltage of the Nch transistor 204 is alleviated by a breakdown voltage Vasp of the electrostatic protection element 226, thereby preventing the Nch transistor 204 from being damaged by electrostatic discharge. The electrostatic protection circuit performs the same electrostatic protection operation even on the Pch transistor 202, so the description thereof is omitted here.

According to the conventional electrostatic protection circuit, when the voltage caused by electrostatic discharge is applied to the input terminal, the discharge current which cannot be absorbed by the main protection element flows into the ground terminal (or the power supply terminal) through the sub-protection element and the impedance circuit (which corresponds to the resistor element R101 in the case of AJITH AMERASEKERA, "ESD in Silicon Integrated Circuits", Second Edition, WILEY, 2002, pp. 117-118 or corresponds to the impedance circuit 224 in the case of US 2005/0231866 A). Therefore, the source-gate voltage of the Nch transistor (Pch transistor) of the input stage driver is alleviated, so the Nch transistor (Pch transistor) can be prevented from being damaged. In the electrostatic protection circuit, a normal signal inputted from the input terminal is not affected by the sub-protection element because the sub-protection element itself is maintained at high impedance.

However, it is liable to adversely affect the normal signal inputted from the input terminal by the impedance circuit. For example, in the case of FIG. 11, the resistor element R101 and a parasitic capacitor formed between the source and drain of the Nch transistor N102 serve as a low-pass filter, thereby cutting off a high frequency component of the signal. In the case of FIG. 12, an amplitude voltage (dynamic range) of an output signal is narrowed by the impedance circuit 224 (222).

SUMMARY

According to the present invention, an electrostatic protection circuit includes a first terminal, a second terminal, a MOS transistor whose gate and source are connected to the first terminal and the second terminal, respectively, an electrostatic protection element connected to a drain of the MOS transistor and coupled to the first terminal.

According to the present invention, a maximum value of a voltage applied to a gate insulating film of the MOS transistor, when an electrostatic discharge is applied to the first or the second terminals, is alleviated to a value equal to or smaller than a desirable value to prevent the MOS transistor from being damaged by electrostatic discharge. In this case, the electrostatic protection element is maintained at high impedance to a normal input signal, so the electrostatic protection can be made without affecting the transfer of the normal input signal.

BRIEF DESCRIPTION OF THE DRAWINGS

The above and other objects, advantages and features of the present invention will be more apparent from the following description of certain preferred modes taken in conjunction with the accompanying drawings, in which.

DETAILED DESCRIPTION OF THE PREFERRED EMBODIMENTS

An electrostatic protection circuit according to Embodiment 1 of the present invention includes a first terminal (In in FIG. 1), a second terminal (GND in FIG. 1), a MOS transistor (N1 in FIG. 1) whose gate and source are connected with the first terminal and the second terminal, respectively, a first electrostatic protection element (20 in FIG. 1) connected between a drain of the MOS transistor and the gate thereof and a second electrostatic protection element (10a in FIG. 1) connected between the first terminal and the second terminal.

A circuit exhibiting low impedance to the discharge current and a normal input signal, such as a capacitor element or a MOS transistor operating at on-state, may be inserted to a connection path between the first terminal and the gate and a connection path between the second terminal and the source. The circuit exhibiting low impedance to the discharge current and the normal input signal, such as a capacitor element or a MOS transistor operating at on-state, may be inserted to connection paths between the first electrostatic protection element and the MOS transistor.

Figure 1:
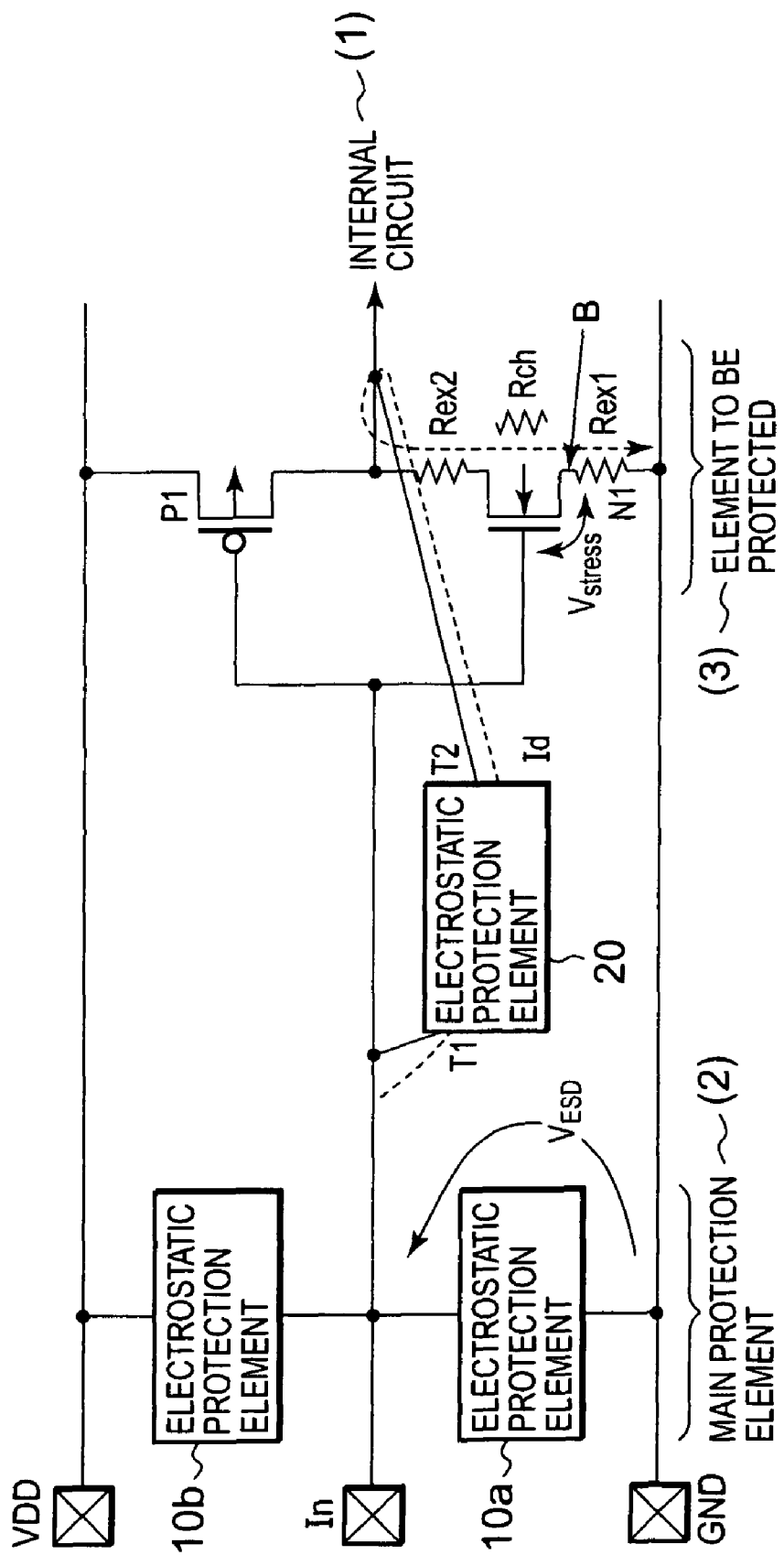
FIG. 1 is a block diagram showing a structure of an electrostatic protection circuit according to Embodiment 1 of the present invention.

The electrostatic protection circuit is desirably constructed such that a maximum value of a voltage applied to a gate insulating film (Vstress in FIG. 1) of the MOS transistor is alleviated to a value smaller than a stressed value at the input node (Vesd in FIG. 1) by an electric potential rise at Point B due to a current flow of the electrostatic discharge current (Id in FIG. 1) into the parasitic source resistance (Rex1 in FIG. 1).

A preferable structure is that the first terminal is an input terminal, the second terminal is a power supply terminal or a ground terminal, an input circuit using the input terminal as an input is provided, and the MOS transistor is included in the input circuit.

The input circuit may include a differential amplifier circuit for input and the MOS transistor may be one transistor of a differential pair of the differential amplifier circuit.

The input circuit may include a differential amplifier circuit for input and the MOS transistor may be a current source transistor connected with sources of differential pair of the differential amplifier circuit.

A circuit into which a current equal to the current flowing into the first electrostatic protection element flows may be inserted between the gate of the MOS transistor and the first terminal.

According to the electrostatic protection circuit having the structure as described above, the current flowing through the first electrostatic protection element at the time of electrostatic application to the first terminal flows between the drain and source of the MOS transistor which is turned on. Therefore, the maximum value of the voltage applied to the gate insulating film of the MOS transistor during electrostatic application is alleviated to a value smaller than the stressed value at the input node (Vesd in FIG. 1), so the MOS transistor can be prevented from being damaged by electrostatic discharge. The first and second electrostatic protection elements are maintained at high impedance to a normal input signal, so the input signal is not degraded. Hereinafter, embodiments of the present invention will be described in detail with reference to the attached drawings.

Embodiment 1

FIG. 1 is a block diagram showing a structure of an electrostatic protection circuit according to Embodiment 1 of the present invention. In FIG. 1, the electrostatic protection circuit includes a power supply terminal VDD, an input terminal In, a ground terminal GND, electrostatic protection elements 10a, 10b, and 20, an Nch transistor N1, and a Pch transistor P1. The electrostatic protection element 10a is inserted between the input terminal In and the ground terminal GND. The electrostatic protection element 10b is inserted between the input terminal In and the power supply terminal VDD. A gate of the Nch transistor N1 and a gate of the Pch transistor P1 are connected common to the input terminal In. A source of the Nch transistor N1 is connected with the ground terminal GND. A source of the Pch transistor P1 is connected with the power supply terminal VDD. A drain of the Nch transistor N1 and a drain of the Pch transistor P1 are connected common to an internal circuit (not shown). The Nch transistor N1 and the Pch transistor P1 serves as the input circuit. The electrostatic protection element 20 is connected between the drain and gate of the Nch transistor N1.

Figures 2A, 2B, 2C, 2D:
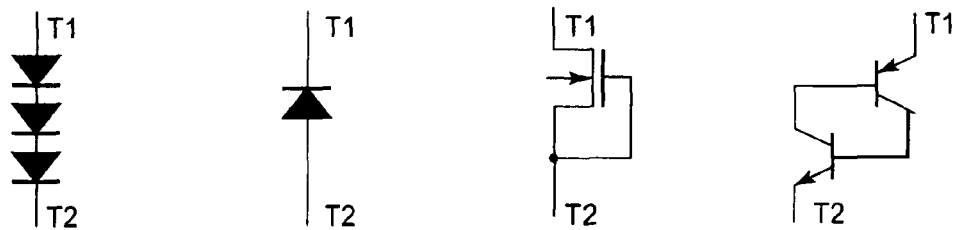
FIGS. 2A to 2F show structural examples of an electrostatic protection element.
Figures 2E, 2F:
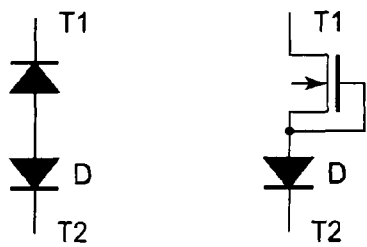

FIGS. 2A to 2F show structural examples of the electrostatic protection element 20. The electrostatic protection element 20 is a circuit which is maintained at high impedance when a voltage applied between two terminals T1 and T2 ((potential at terminal T1)>(potential at terminal T2)) is equal to or smaller than a predetermined voltage and which exhibits low impedance when the voltage exceeds the predetermined voltage. For example, as shown in FIG. 2A, a circuit including a plurality of diodes (three diodes in FIG. 2A) connected in series in the forward direction may be used. As shown in FIG. 2B, a diode connected in a reverse direction to cause breakdown in a PN junction may be used. As shown in FIG. 2C, an Nch transistor whose gate and source are connected common to each other to cause breakdown between a drain and the source may be used. As shown in FIG. 2D, a thyristor structure in which a PNP transistor and an NPN transistor are combined may be employed. As shown in FIG. 2E, a circuit may be used in which a diode D for backflow prevention is connected in series with the protection circuit of FIG. 2B. As shown in FIG. 2F, a circuit may be used in which the diode D for backflow prevention is connected in series with the protection circuit of FIG. 2C. According to the circuits shown in FIGS. 2E and 2F, even when the potential at the terminal T2 is sufficiently larger than the potential at the terminal T1, a high impedance is held by the diode D.

In the electrostatic protection circuit having the structure as described above, each of the electrostatic protection elements 10a and 10b acts as a second protection element (main protection element) and the electrostatic protection element 20 acts as a first protection element (sub-protection element). The Nch transistor N1 corresponds to an element to be protected by the electrostatic protection elements 10a, 10b, and 20.

Figure 3:
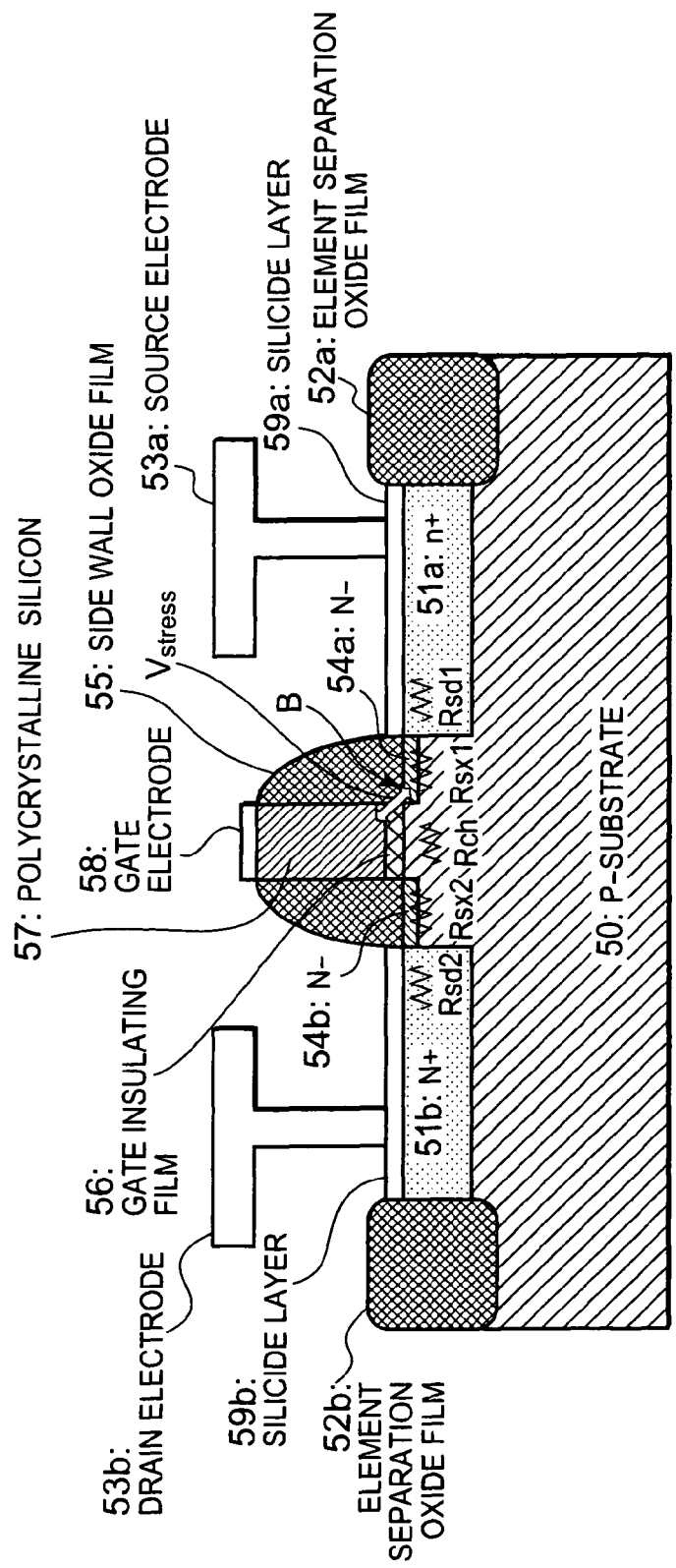
FIG. 3 is a cross sectional view showing a normal structure of an Nch transistor.

Next, a structure of the Nch transistor N1 will be described. FIG. 3 is a cross sectional view showing a structure of a normal Nch transistor. $N^+$-diffusion layers 51a and 51b are formed in an upper layer of a P-substrate 50 and sandwiched between element separation oxide films 52a and 52b. A silicide layer 59a is formed on a surface of the $N^+$-diffusion layer 51a. The silicide layer 59a is connected with a source electrode 53a through a contact. A silicide layer 59b is formed on a surface of the $N^+$-diffusion layer 51b. The silicide layer 59b is connected with a drain electrode 53b through a contact. An $N^-$-diffusion layer 54a is formed in the upper layer of the P-substrate 50 to extend from an end of the $N^+$-diffusion layer 51a toward the $N^+$-diffusion layer 51b. An $N^-$-diffusion layer 54b is formed in the upper layer of the P-substrate 50 to extend from an end of the $N^+$-diffusion layer 51b toward the $N^+$-diffusion layer 51a. A side wall oxide film 55 is formed on the $N^-$-diffusion layers 54a and 54b. A gate insulating film 56, a polycrystalline silicon gate 57, and a gate electrode 58 are formed in order from the lower side on a region of the P-substrate 50 which is sandwiched between the $N^-$-diffusion layers 54a and 54b. The gate insulating film 56, the polycrystalline silicon gate 57, and the gate electrode 58 are surrounded by the side wall oxide film 55.

A drain-source resistance of the Nch transistor having the structure described above corresponds to a sum of (1) the resistance Rsd2 of the diffusion layer located on the drain side of the Nch transistor (resistance of $N^+$-diffusion layer 51b), (2) the resistance Rex2 of an extension region ($N^-$-diffusion layer 54b) located under a side wall (side wall oxide film 55) formed on the drain side, (3) the channel resistance Rch between the drain and source of the Nch transistor, (4) the resistance Rex1 of an extension region ($N^-$-diffusion layer 54a) located under a side wall (side wall oxide film 55) formed on the source side, and (5) the resistance Rsd1 of the diffusion layer located on the source side of the Nch transistor (resistance of $N^+$-diffusion layer 51a).

Assume that, in FIG. 1, a voltage VESD which is positive relative to the ground terminal GND and caused by electrostatic discharge is applied to the input terminal In. In such a case, because a gate-source voltage of the Nch transistor N1 is positive, the Nch transistor N1 turns on. Then a discharge current Id, which cannot be absorbed by the electrostatic protection element 10a, flows into the ground terminal GND through the electrostatic protection element 20 and the drain-source resistance (Rsd2, Rex2, Rch, Rex1, and Rsd1) in the Nch transistor N1. This leads to the potential rise at the point B (the point in the layer 54a closest to the drain in FIG. 3). The potential rise at the point B reduces the maximum voltage of Vstress, applied to the gate insulating film in the Nch transistor N1, below VESD. Therefore the Nch transistor N1 is protected from being damaged by electrostatic discharge.

Therefore, the Nch transistor N1 is prevented from being damaged by electrostatic discharge.

In the case of a normal MOS transistor, the resistances Rex1 and Rex2 are resistance values which are very larger than the resistances Rsd1 and Rsd2. Therefore, the increase in potential at the B-point is greatly affected by the resistance Rex1. Note that, in the case of a multigate transistor called a fin field effect transistor (FinFET), the values of the resistances Rsd1 and Rsd2 are large, so the increase in potential at the B-point is affected by both the resistances Rsd1 and Rex1.

The normal input signal has a level between a potential at the ground terminal GND and a potential at the power supply terminal VDD. Therefore, in a normal operation, each of the electrostatic protection elements 10a, 10b, and 20 exhibits high impedance, so a signal inputted from the input terminal In is not degraded thereby. In contrast to this, when the positive voltage of VESD to the ground terminal GND is applied to the input terminal In, the input signal has a higher potential than a potential at the power supply terminal VDD. This higher potential enables the electrostatic protection element 20 to becomes low impedance and thus act as an electrostatic protection element.

When a semiconductor device includes the electrostatic protection circuit as described above, the semiconductor device operates without affecting the normal input signal and thus has a sufficient tolerance to electrostatic discharge.

Embodiment 2

Figure 4:
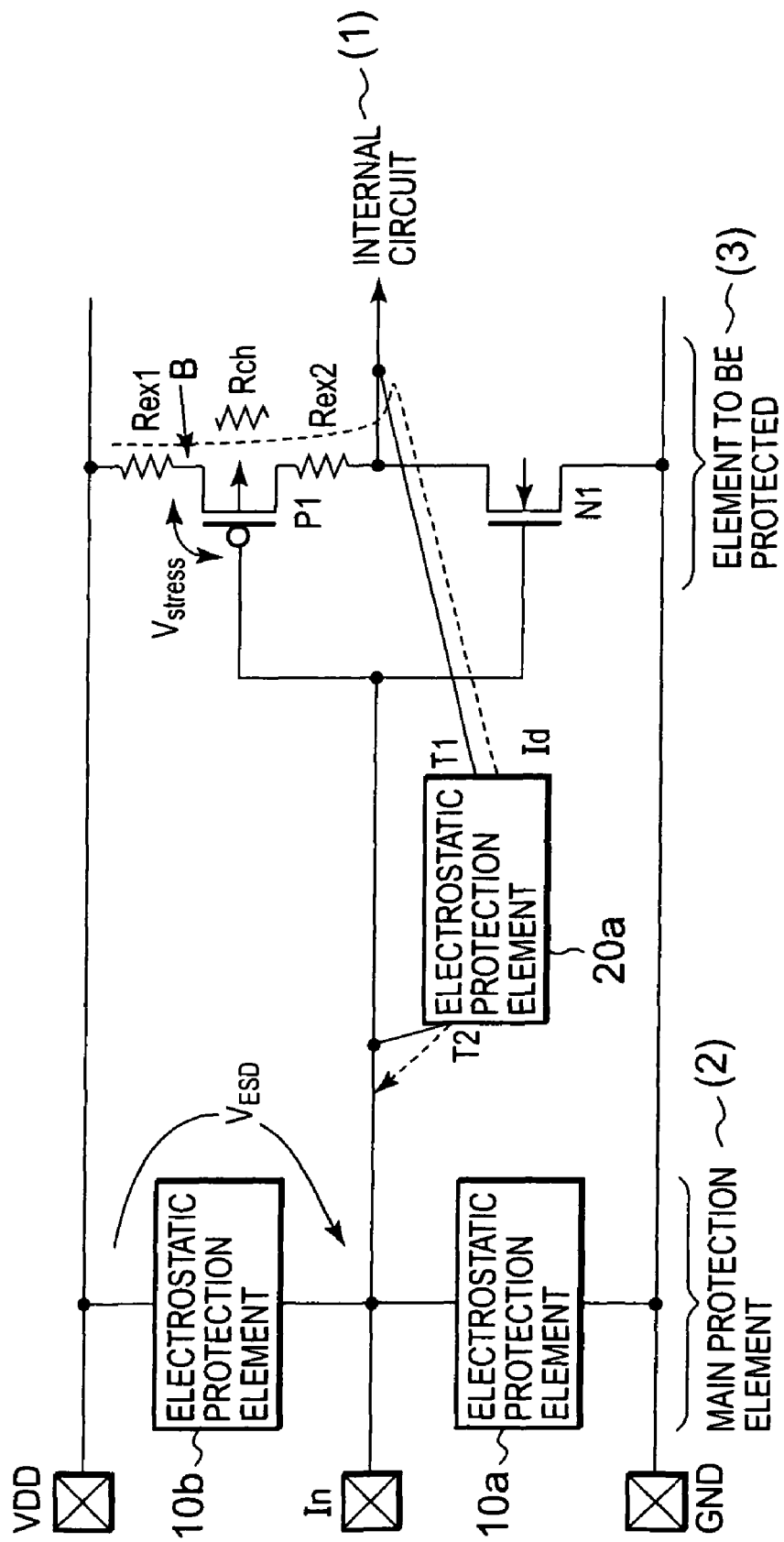
FIG. 4 is a block diagram showing a structure of an electrostatic protection circuit according to Embodiment 2 of the present invention.

FIG. 4 is a block diagram showing a structure of an electrostatic protection circuit according to Embodiment 2 of the present invention. In FIG. 4, the same symbols as in FIG. 1 indicate the same elements, and thus the description is omitted here. The electrostatic protection circuit shown in FIG. 4 includes an electrostatic protection element 20a connected between the drain and gate of the Pch transistor P1, instead of the electrostatic protection element 20. The electrostatic protection element 20a has the same structure as the electrostatic protection element 20 shown in FIG. 1, but the connection thereof is reversed to that of the electrostatic protection element 20. When a circuit acts as a protection element in each direction as shown in FIG. 2E, the circuit structure shown in FIG. 4 is identical to that shown in FIG. 1.

In the electrostatic protection circuit having the structure as described above, each of the electrostatic protection elements 10a and 10b acts as the second protection element (main protection element) and the electrostatic protection element 20a acts as the first protection element. The Pch transistor P1 corresponds to an element to be protected by the electrostatic protection elements 10a, 10b, and 20a. That is, when the electrostatic discharge voltage VESD which is negative relative to the power supply terminal VDD is applied to the input terminal In, the Pch transistor P1 turns on. Then the discharge current Id which cannot be absorbed by the electrostatic protection element 10b flows from the power supply terminal VDD into the input terminal In through the electrostatic protection element 20a and the drain-source resistance (Rex1, Rch, and Rex2) in the Pch transistor P1. This leads to the potential drop at Point B in the Pch transistor P1. The potential drop at Point B reduces the maximum voltage of Vstress, applied to the gate insulating film in the Pch transistor P1, below VESD. Therefore the Pch transistor P1 is protected from being damaged by electrostatic discharge.

Assume that the Pch transistor P1 is a normal MOS transistor, the resistances Rex1 and Rex2 are resistance values which are considerably larger than the resistances Rsd1 and Rsd2, and the resistances Rsd1 and Rsd2 are neglected.

Each of the electrostatic protection elements 10a, 10b, and 20a exhibits high impedance to an output signal having a normal level, so a signal inputted from the input terminal In is not adversely affected thereby. In contrast to this, when the voltage VESD which is negative relative to the power supply terminal VDD and caused by electrostatic discharge is applied to the input terminal In to increase a signal in a negative direction, the electrostatic protection element 20a becomes low impedance and thus acts as an electrostatic protection element.

Embodiment 3

Figure 5:
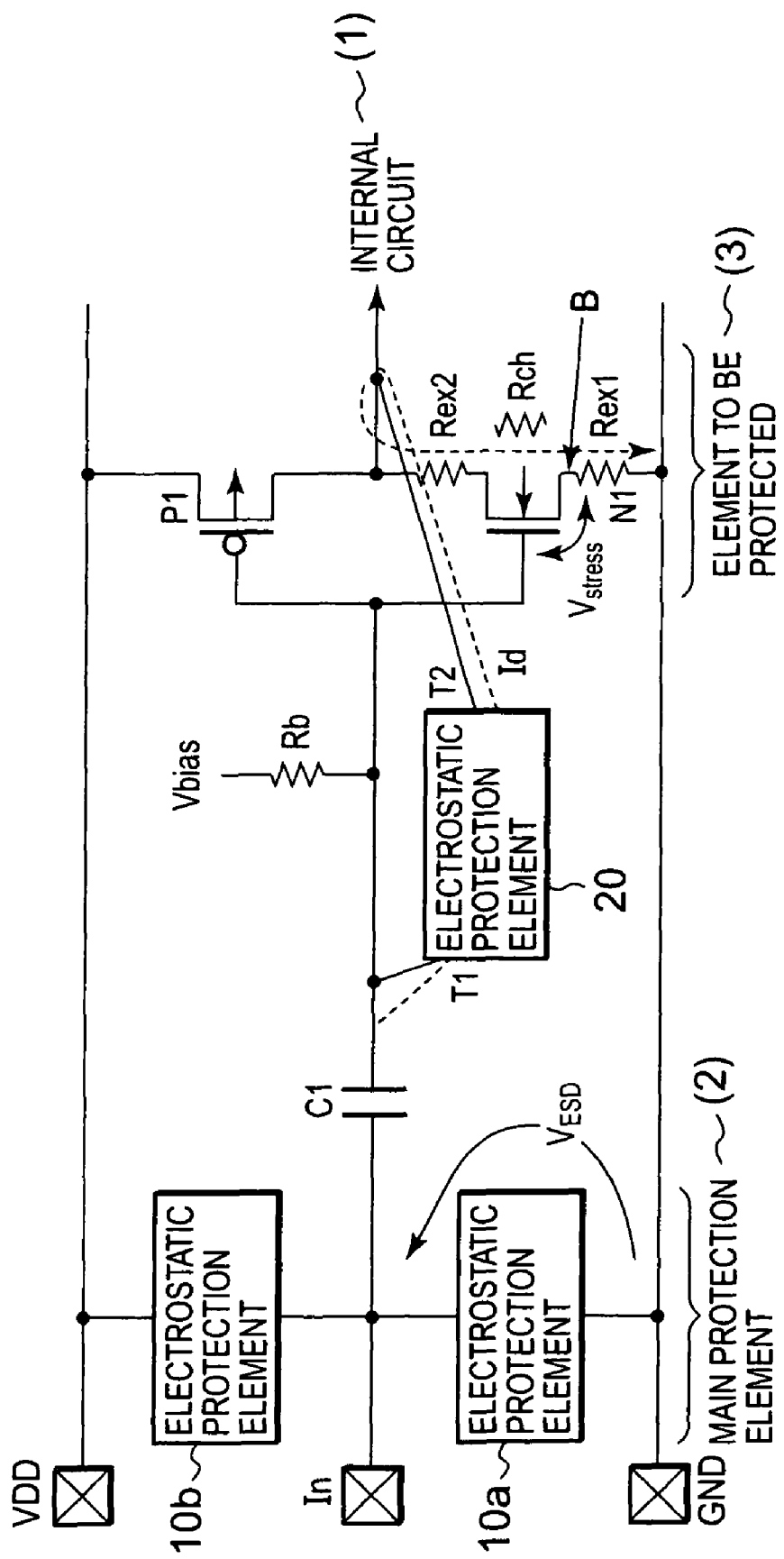
FIG. 5 is a block diagram showing a structure of an electrostatic protection circuit according to Embodiment 3 of the present invention.

FIG. 5 is a block diagram showing a structure of an electrostatic protection circuit according to Embodiment 3 of the present invention. In FIG. 5, the same symbols as in FIG. 1 indicate the same elements, and thus the description thereof is omitted here. The electrostatic protection circuit shown in FIG. 5 includes a capacitor element C1 provided between the input terminal In and a connection point between the gates of the Nch transistor N1 and the Pch transistor P1 and an end (T1) of the electrostatic protection circuit 20. The capacitor element C1 is assumed as a low-impedance element to each of the voltage VESD which is applied to the input terminal In and caused by electrostatic discharge and an alternating current signal inputted to the input terminal In, so the capacitor element C1 can be neglected. Assume that the gates of the Nch transistor N1 and the Pch transistor P1 are supplied with a bias voltage Vbias through a resistor element Rb having a large resistance value. Therefore, the electrostatic protection circuit shown in FIG. 5 operates as described in Embodiment 1, with the result that the Nch transistor N1 is prevented from being damaged by electrostatic discharge.

Embodiment 4

Figure 6:
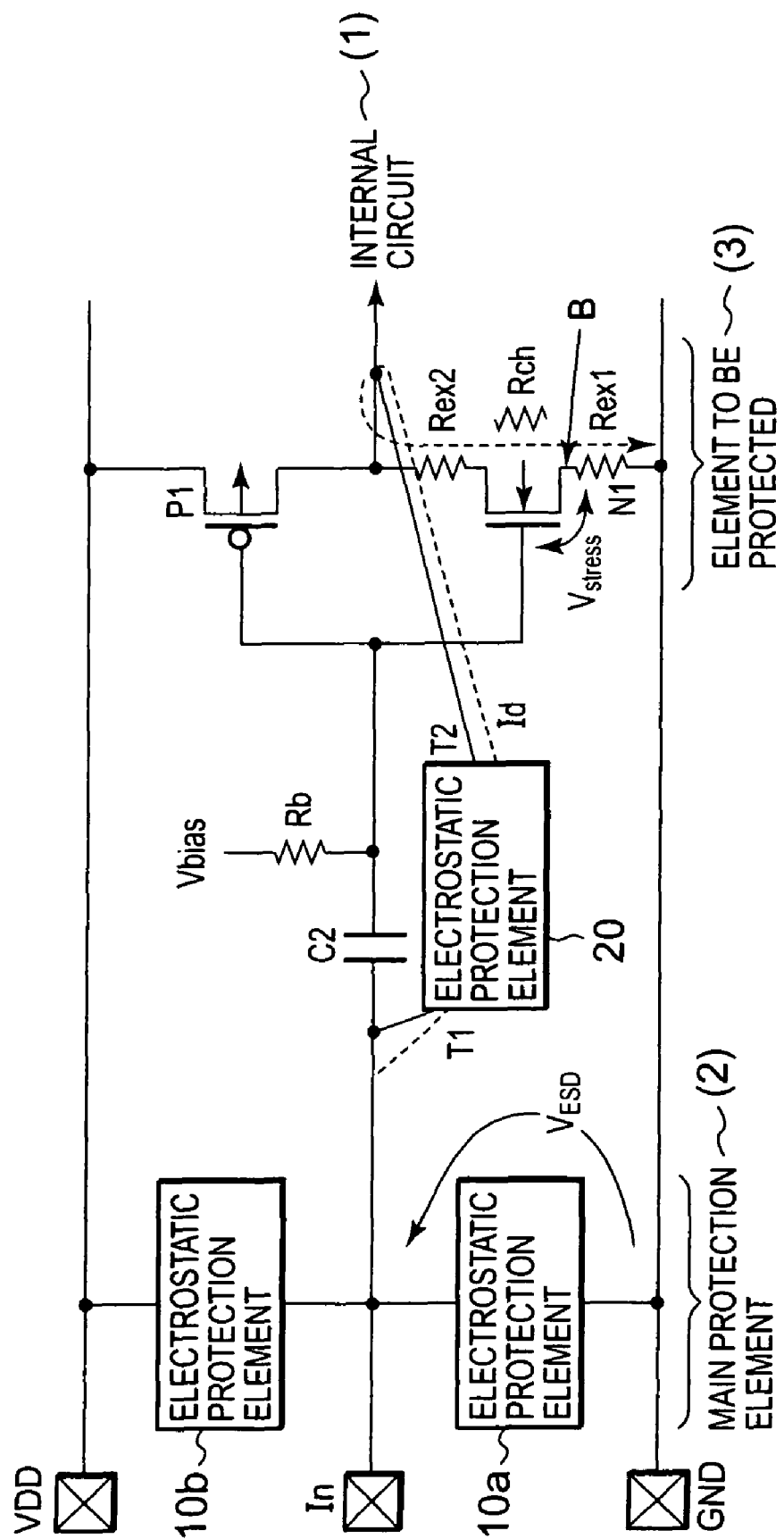
FIG. 6 is a block diagram showing a structure of an electrostatic protection circuit according to Embodiment 4 of the present invention.

FIG. 6 is a block diagram showing a structure of an electrostatic protection circuit according to Embodiment 4 of the present invention. In FIG. 6, the same symbols as in FIG. 1 indicate the same elements, and thus the description thereof is omitted here. The electrostatic protection circuit shown in FIG. 6 includes a capacitor element C2 provided between a connection point between the gate of the Nch transistor N1 and the gate of the Pch transistor P1 and a connection point between the end (T1) of the electrostatic protection element 20 and the input terminal In. The electrostatic protection element 20 is connected between the drain and gate of the Nch transistor N1 through the capacitor element C2. The capacitor element C2 is assumed as the low-impedance element to each of the voltage VESD which is applied to the input terminal In and caused by electrostatic discharge and the alternating current signal inputted to the input terminal In, so the capacitor element C2 can be neglected. Assume that the gates of the Nch transistor N1 and the Pch transistor P1 are supplied with the bias voltage Vbias through the resistor element Rb having the large resistance value. Therefore, the electrostatic protection circuit shown in FIG. 6 operates as described in Embodiment 1, with the result that the Nch transistor N1 is prevented from being damaged by electrostatic discharge.

Embodiment 5

Figure 7:
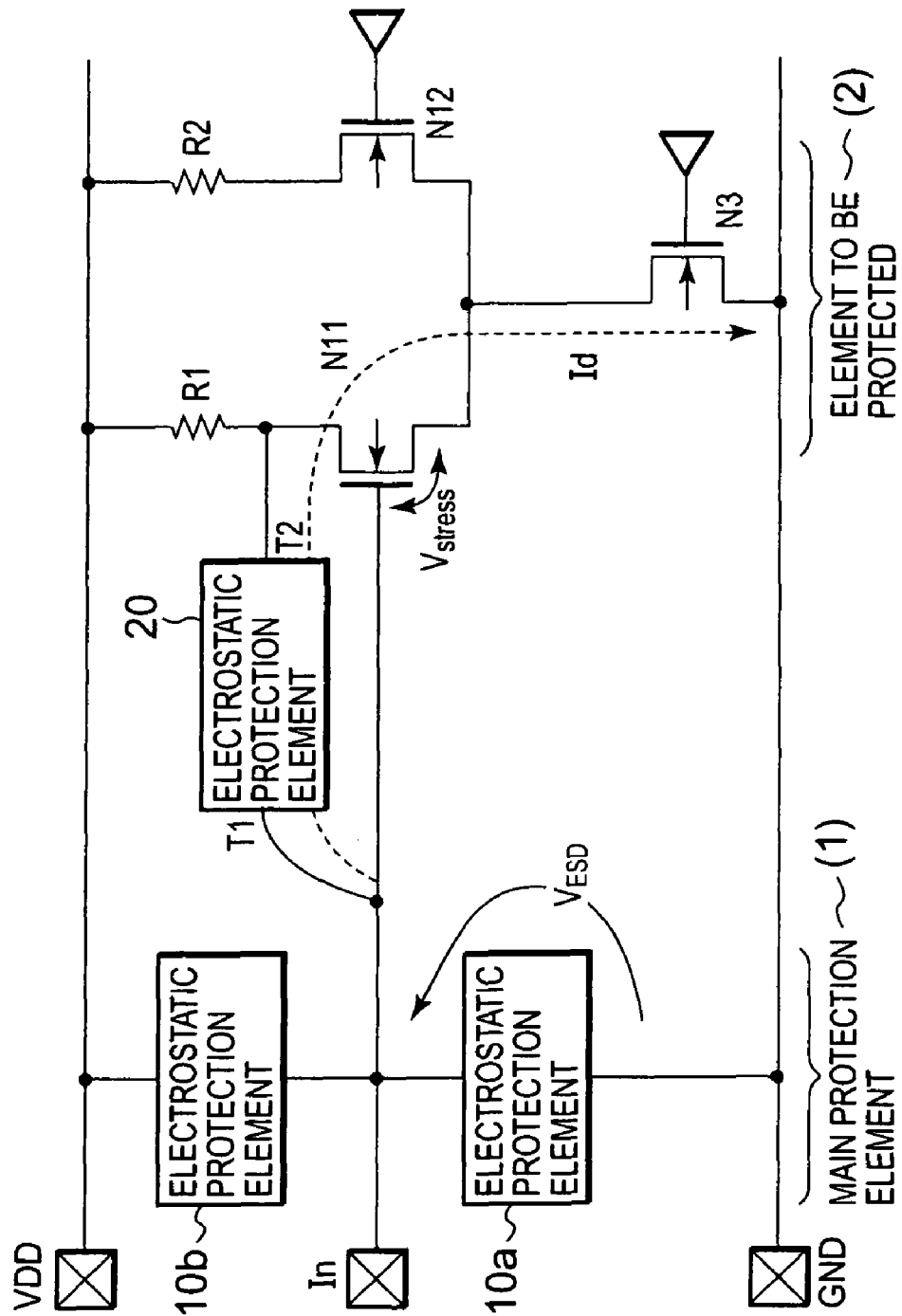
FIG. 7 is a block diagram showing a structure of an electrostatic protection circuit according to Embodiment 5 of the present invention.

FIG. 7 is a block diagram showing a structure of an electrostatic protection circuit according to Embodiment 5 of the present invention. In FIG. 7, the same symbols as in FIG. 1 indicate the same elements, and thus the description thereof is omitted here. In the electrostatic protection circuit shown in FIG. 7, the element to be protected is an Nch transistor N11 which is a part of a differential amplifier. That is, the Nch transistor N11 and an Nch transistor N12 serve as a differential pair. A source of the Nch transistor N11 and a source of the Nch transistor N12 are connected common to a drain of an Nch transistor N3 which acts as a current source. A source of the Nch transistor N3 is connected with the ground terminal GND and a gate thereof is connected with an internal circuit (not shown). A gate of the Nch transistor N11 is connected with the input terminal In and a drain thereof is connected with the power supply terminal VDD through a resistor element R1. A drain of the Nch transistor N12 is connected with the power supply terminal VDD through a resistor element R2. Note that a gate of the Nch transistor N12 is connected with the internal circuit (not shown).

According to the electrostatic protection circuit having the structure as described above, when the voltage VESD caused by electrostatic discharge is applied to the input terminal In and the Nch transistor N3 is in an on-state, the discharge current Id which cannot be absorbed by the electrostatic protection element 10a flows into the ground terminal GND through the electrostatic protection element 20, the Nch transistor N11, and the Nch transistor N3 which is in the on-state. Therefore, the electrostatic protection circuit shown in FIG. 7 operates as described in Embodiment 1, with the result that the Nch transistor N11 is prevented from being damaged by electrostatic discharge.

Embodiment 6

Figure 8:
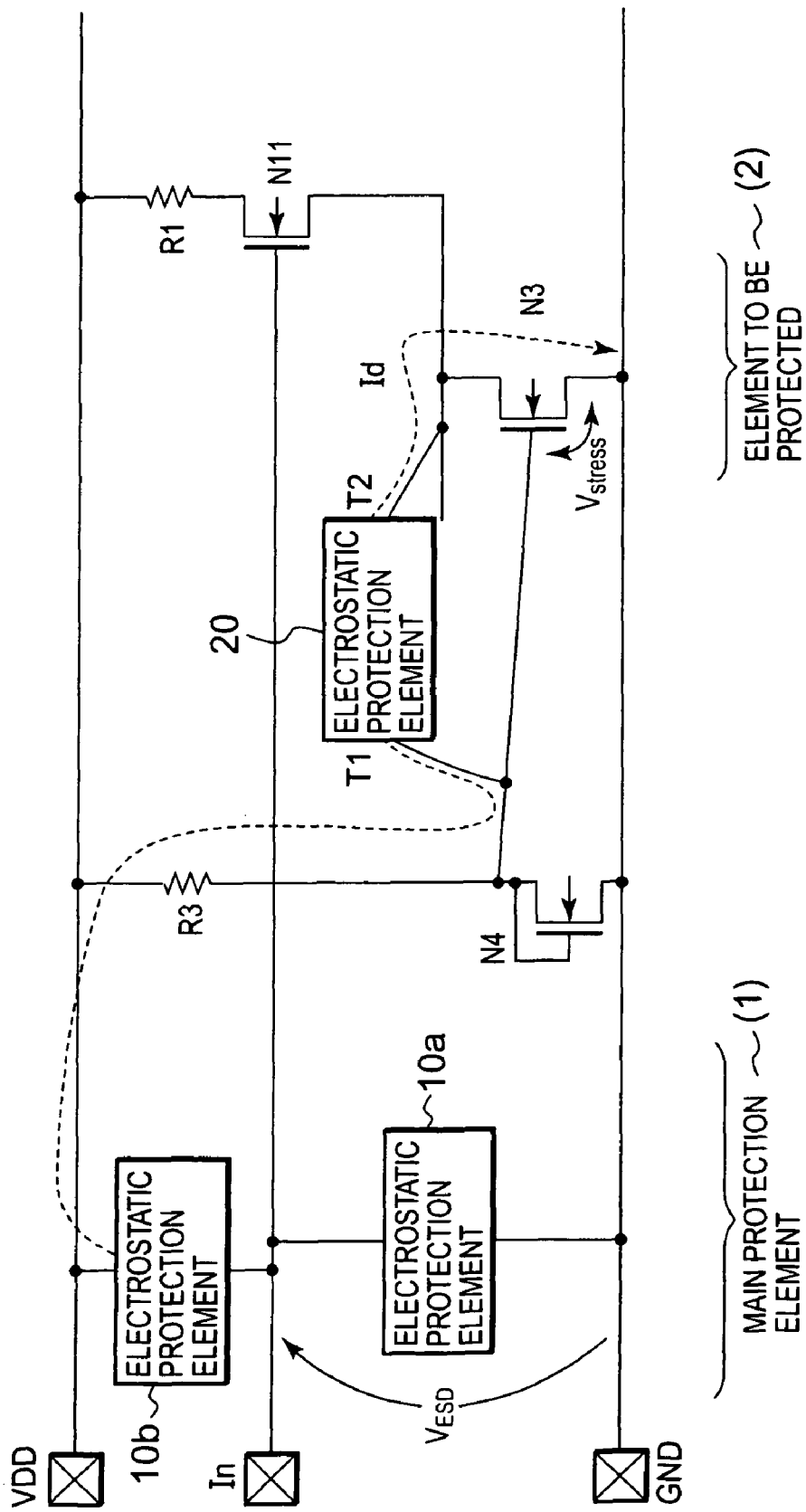
FIG. 8 is a block diagram showing a structure of an electrostatic protection circuit according to Embodiment 6 of the present invention.

FIG. 8 is a block diagram showing a structure of an electrostatic protection circuit according to Embodiment 6 of the present invention. In FIG. 8, the same symbols as in FIG. 7 indicate the same elements, and thus the description thereof is omitted here. In the electrostatic protection circuit shown in FIG. 8, a source of a diode-connected transistor N4 is connected with the ground terminal GND, and a drain thereof is connected to the power supply terminal VDD through a resistor R3. The gate of the Nch transistor N3 is connected with the drain of the Nch transistor N4 and the end (T1) of the electrostatic protection element 20. The drain of the Nch transistor N3 is connected with another end (T2) of the electrostatic protection element 20.

Assume that, in the electrostatic protection circuit having the structure as described above, the voltage VESD caused by electrostatic discharge is applied to the input terminal In. In such a case, the discharge current Id flows into the ground terminal GND through the electrostatic protection element 10b, the resistor element R3, the electrostatic protection element 20, and the Nch transistor N3. Even in such a case, the electrostatic protection circuit shown in FIG. 8 operates as described in Embodiment 1, with the result that the Nch transistor N3 is prevented from being damaged by electrostatic discharge.

Embodiment 7

Figure 9:
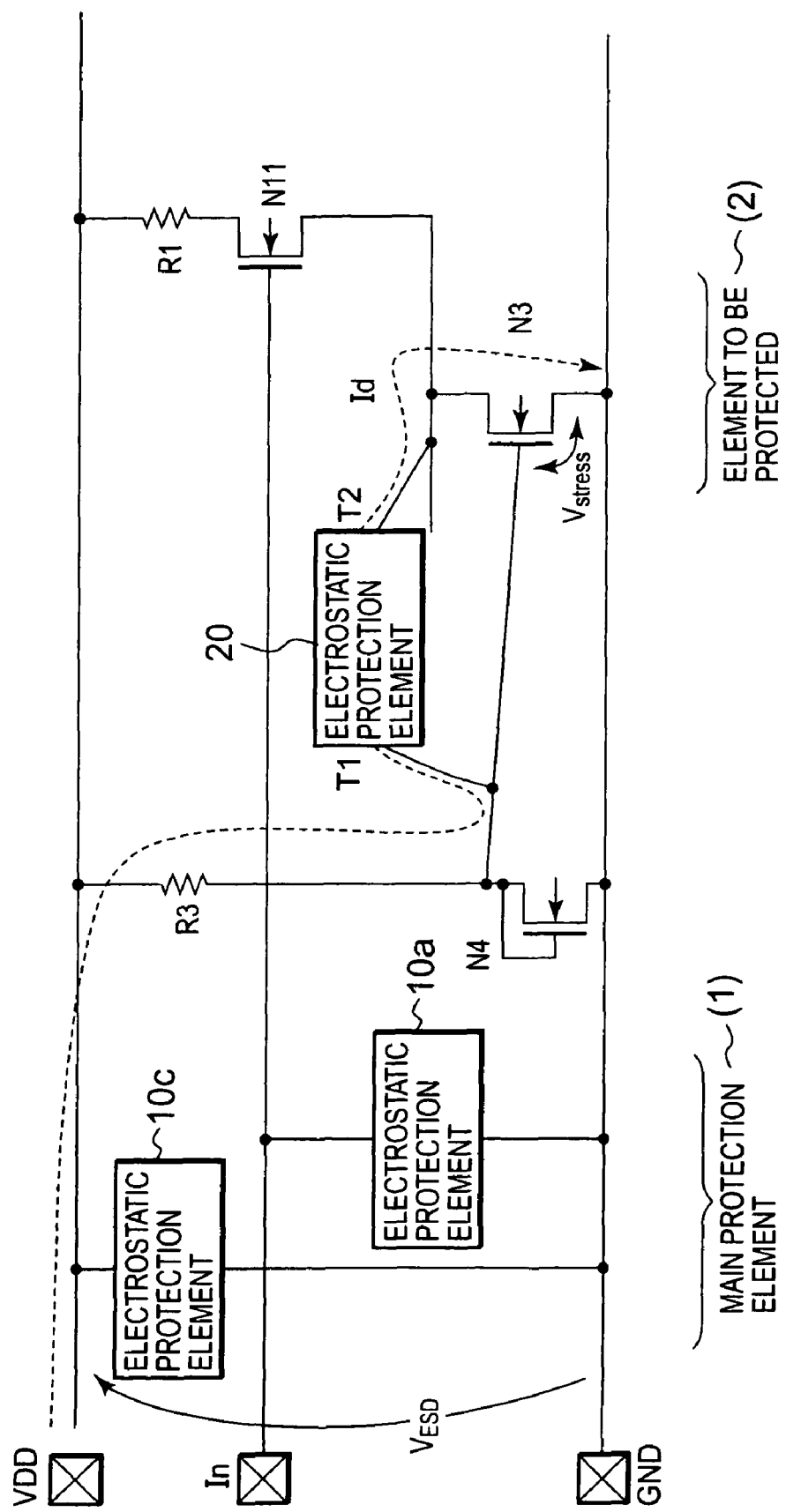
FIG. 9 is a block diagram showing a structure of an electrostatic protection circuit according to Embodiment 7 of the present invention.
Figure 10:
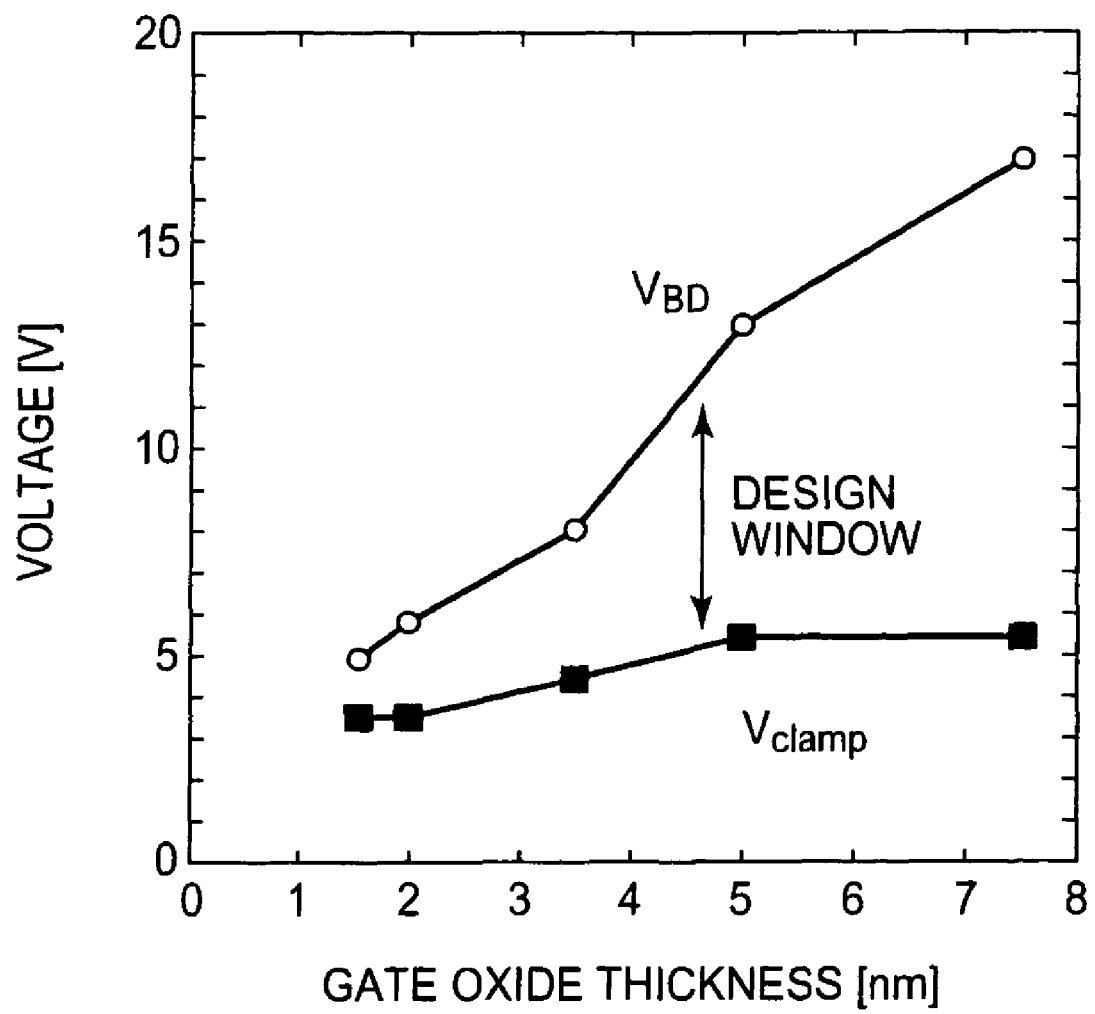
FIG. 10 shows a change in breakdown voltage (VBD) of a gate oxide film and a change in clamp voltage (Vclamp) of a protection element, which are caused by a reduction in transistor size.
Figure 11:
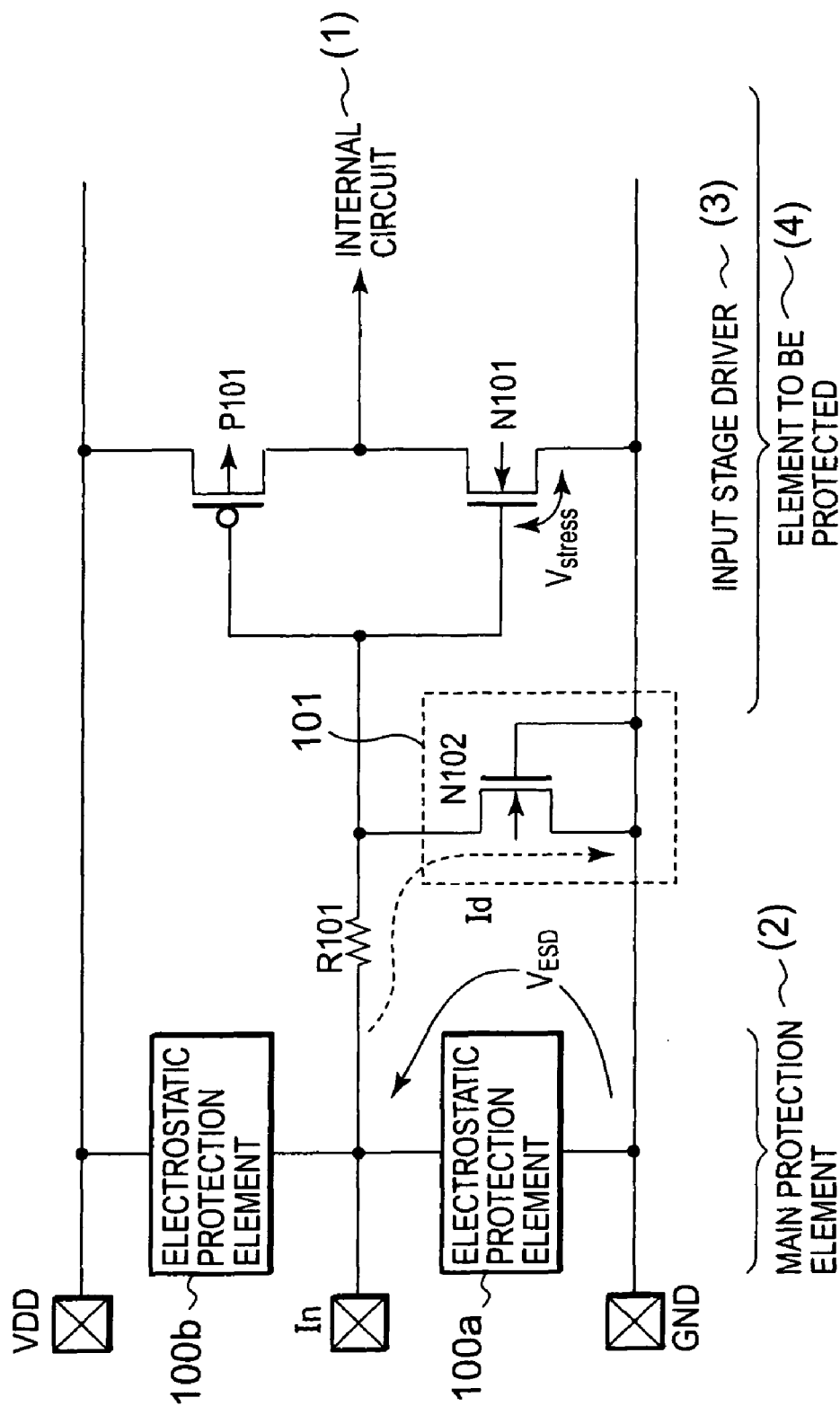
FIG. 11 is a circuit diagram showing a first example of a conventional electrostatic protection circuit.
Figure 12:
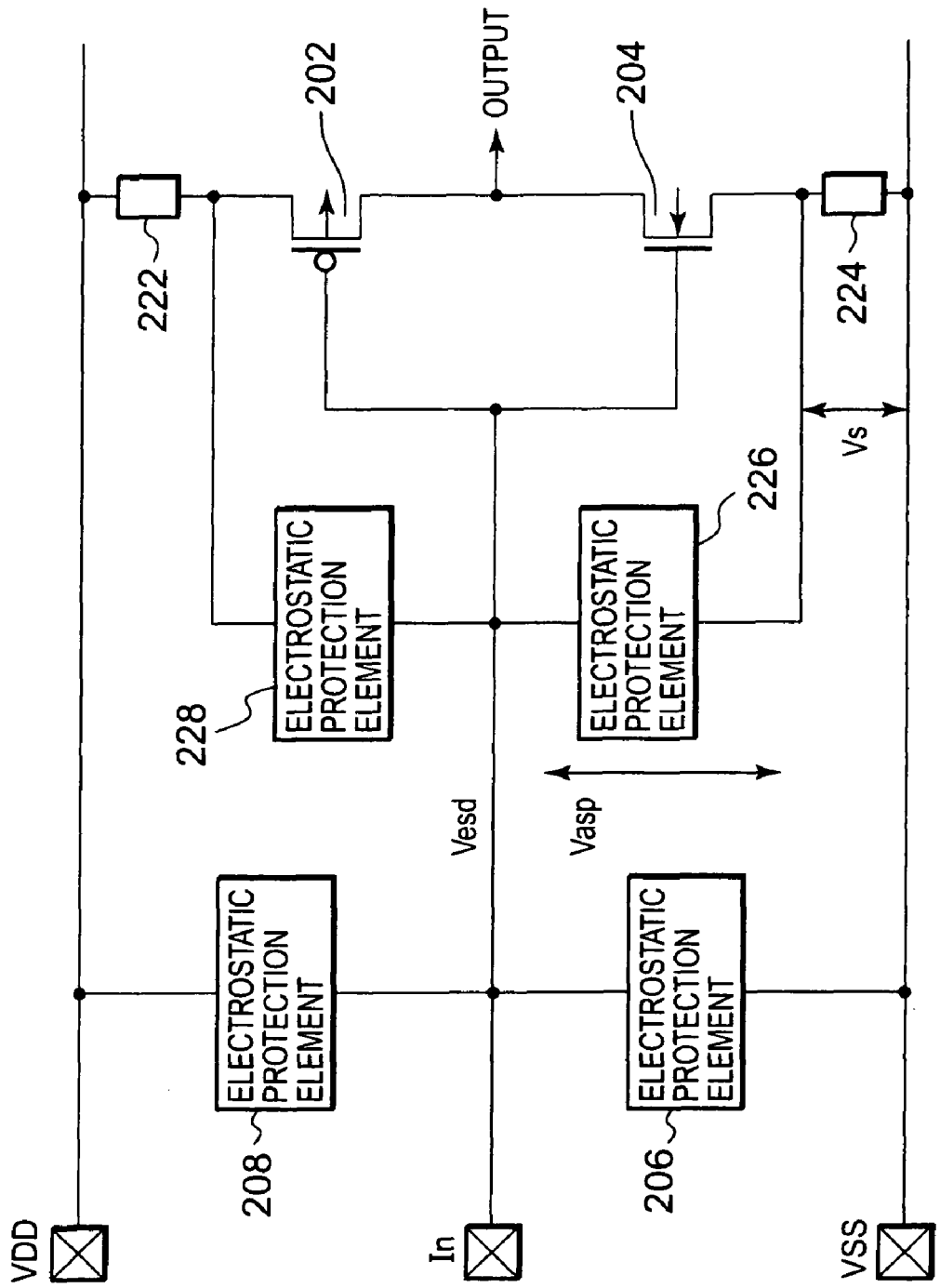
FIG. 12 is a circuit diagram showing a second example of the conventional electrostatic protection circuit.

FIG. 9 is a block diagram showing a structure of an electrostatic protection circuit according to Embodiment 7 of the present invention. In FIG. 9, the same symbols as in FIG. 8 indicate the same elements, and thus the description thereof is omitted here. In the electrostatic protection circuit shown in FIG. 9, the electrostatic protection element 10b shown in FIG. 8 is removed and an electrostatic protection element 10c is inserted between the power supply terminal VDD and the ground terminal GND.

Assume that, in the electrostatic protection circuit having the structure as described above, the voltage VESD caused by electrostatic discharge is applied to the power supply terminal VDD and then the discharge current Id flows into the ground terminal GND through the resistor element R3, the electrostatic protection element 20, and the Nch transistor N3. Even in such a case, the electrostatic protection circuit shown in FIG. 9 operates as described in Embodiment 1, with the result that the Nch transistor N3 is prevented from being damaged by electrostatic discharge.

As described in Embodiments 6 and 7, a MOS transistor to be protected from electrostatic damage may be a transistor for current source which is connected with the sources of the differential pair. The MOS transistor to be protected from electrostatic damage is not limited to the transistor for current source which is connected with the sources of the differential pair. The present invention can be also applied to the case where the electrostatic discharge current applied to the input terminal or the power supply terminal flows into the first electrostatic protection element through an additional circuit inserted between the gate of the MOS transistor and one of the input terminal and the power supply terminal.

The present invention is described with reference to the embodiments. The present invention is not limited to only the embodiments and thus includes various changes and medications which could be made by a person skilled in the art within the scope of the invention as defined by the claims in this application.

What is claimed is:

1. An electrostatic protection circuit, comprising:
   a first terminal;
   a second terminal;
   a MOS transistor including a gate, a source, and a drain, the gate being coupled to the first terminal, the source being coupled to the second terminal;
   an electrostatic protection element connected to the drain, wherein the electrostatic protection element comprises a first electrostatic protection element; and
   a second electrostatic protection element connected between the first terminal and the second terminal,
   wherein the electrostatic protection circuit is constructed such that a maximum value of a voltage applied to a gate insulating film of the MOS transistor is alleviated to a value equal to or smaller than a desirable value by a current flowing into the first electrostatic protection element at a time of electrostatic application to the first terminal and an internal parasitic resistance of the MOS transistor connected with the second terminal.

2. The electrostatic protection circuit according to claim 1 wherein:
   the first terminal comprises one of an input terminal and a power supply terminal;
   the second terminal comprises one of a power supply terminal and a ground terminal;
   the electrostatic protection circuit further comprises an input circuit receiving an input at the input terminal; and
   the MOS transistor is included in the input circuit.

3. The electrostatic protection circuit according to claim 2, wherein:
   the input circuit comprises a differential amplifier for input which includes transistors as a differential pair; and
   the MOS transistor comprises one of the transistors of the differential amplifier.

4. The electrostatic protection circuit according to claim 2, wherein:
   the input circuit comprises a differential amplifier for input which includes transistors as a differential pair; and
   the MOS transistor comprises one of the transistors of the differential amplifier which is connected as a current source with the input terminal.

5. The electrostatic protection circuit according to claim 1, further comprising a circuit provided between the first protection element and the first terminal,
   wherein a current flowing into the circuit flows into the first electrostatic protection circuit.

6. A semiconductor device, comprising the electrostatic protection circuit according to claim 1.

* * * * *